(12) United States Patent
Krebs et al.

(10) Patent No.: US 8,947,926 B2
(45) Date of Patent: Feb. 3, 2015

(54) SEMICONDUCTOR STACK INCORPORATING PHASE CHANGE MATERIAL

(71) Applicant: International Business Machines Corporation, Armonk, NY (US)

(72) Inventors: Daniel Krebs, Rueschlikon (CH); Abu Sebastian, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/967,411

(22) Filed: Aug. 15, 2013

(65) Prior Publication Data

US 2014/0063932 A1 Mar. 6, 2014

(30) Foreign Application Priority Data

Aug. 29, 2012 (GB) .................................. 1215340.9

(51) Int. Cl.
*G11C 13/00* (2006.01)
*H01L 27/24* (2006.01)

(52) U.S. Cl.
CPC .......... *H01L 27/2481* (2013.01); *G11C 13/004* (2013.01)
USPC ....................................................... 365/163

(58) Field of Classification Search
USPC ....................................................... 365/163
See application file for complete search history.

(56) References Cited

U.S. PATENT DOCUMENTS

| 4,646,266 A | 2/1987 | Ovshinsky et al. |
| 7,186,998 B2 | 3/2007 | Ovshinsky et al. |
| 7,969,769 B2 * | 6/2011 | Lowrey .......................... 365/163 |
| 2008/0175031 A1 | 7/2008 | Park et al. |
| 2009/0014885 A1 | 1/2009 | Chen et al. |
| 2009/0039331 A1 | 2/2009 | Clevenger et al. |
| 2010/0034011 A1 | 2/2010 | Xi et al. |

(Continued)

FOREIGN PATENT DOCUMENTS

WO 9720391 A1 6/1997

OTHER PUBLICATIONS

K.N. Chen, et al., "Programmable Via Using Indirectly Heated Phase-Change Switch for Reconfigurable Logic Applications," IEEE Electron Device Letters, vol. 29, No. 1, Jan. 2008, pp. 1-3.*

(Continued)

*Primary Examiner* — Harry W Byrne
*Assistant Examiner* — Lance Reidlinger
(74) *Attorney, Agent, or Firm* — Cantor Colburn LLP; Gail Zarick

(57) ABSTRACT

A semiconductor stack for performing at least a logic operation includes adjacent layers arranged in a stacked configuration with each layer comprising at least a phase-change memory cell in which a phase-change material is provided between a heater electrical terminal and at least two further heater electrical terminals, the phase-change material between the heater electrical terminal and each of the two further heater electrical terminals being operable in one of at least two reversibly transformable phases, an amorphous phase and a crystalline phase; wherein the semiconductor stack, when in use, is configurable to store information by way of an electrical resistance of the phase of the phase-change material between each heater electrical terminal and each of the two further heater electrical terminals in each layer, and the logic operation is performed on the basis of the information stored in the adjacent layers.

6 Claims, 2 Drawing Sheets

(56) References Cited

U.S. PATENT DOCUMENTS

2010/0226195 A1 9/2010 Lue
2011/0096594 A1 4/2011 Franceschini et al.
2011/0266623 A1 11/2011 Han et al.
2012/0182794 A1 7/2012 Kordus, II et al.

OTHER PUBLICATIONS

GB Search Report; Intellectual Property Office; Application No. GB1215340.9, Patents Act 1977: Search Report under Section 17(5); Date Mailed: Nov. 2, 2012; pp. 1-4.

* cited by examiner

SEMICONDUCTOR STACK INCORPORATING PHASE CHANGE MATERIAL

PRIORITY

This application claims priority to Great Britain Patent Application No. 1215340.9, filed Aug. 29, 2012, and all the benefits accruing therefrom under 35 U.S.C. §119, the contents of which in its entirety are herein incorporated by reference.

BACKGROUND

The present invention relates to a semiconductor stack for performing a logic operation that has a capability of storing information related to/involved in the logic operation.

For performing logic operations, it is known to use multiple, individual electronic devices such as, for example, electronic transistors, which are connected to each other, in an electrical circuit. To perform a given logic operation, a given set of electronic devices in a predefined electrical circuit is used. So that different logic operations may be performed, each electrical circuit predefined and/or allocated for the performance of a given logic operation, via its constituent given set of electronic devices, may be embedded in an integrated circuit and/or a semiconductor device.

A problem associated with performing logic operations using an integrated circuit and/or semiconductor device as above-described may be limited flexibility and/or versatility since a given logic operation may only be performed by an electrical circuit comprising a given set of electronic devices predefined for the performance of that task and not interchangeably with and/or between other electrical circuits configured, or having the ability to perform logic operations. A further related problem may be that, since a specific amount of space is to be reserved for the integration of the electrical circuits, each predefined to perform a given logic operation, the density of an integrated circuit/device using such electrical circuits to perform logic operations may be relatively reduced.

In known logic devices and/or applications, logic functionality is based on information that is volatile, such as, for example, charge. In this regard, the information representing the logic inputs is obtained from storage, a given logic operation is performed on the logic inputs and the result of the logic operation, the logic output, is stored away. To be provided in respect of the information involved in/related to the logic operation, namely the logic inputs and the logic output, are resources to conduct the steps for obtaining the logic inputs and storing the logic output and space/memory for storing such information.

U.S. Pat. No. 7,186,998B2 discloses a multi-terminal logic device, which includes a phase-change material having crystalline and amorphous states in electrical communication with three or more electrical terminals. The phase-change material is able to undergo reversible transformations between amorphous and crystalline states in response to applied electrical energy where the amorphous and crystalline states show measurably distinct electrical resistances. Electrical energy in the form of current or voltage pulses applied between a pair of terminals influences the structural state and measured electrical resistance between the terminals. In the devices disclosed in this document, independent input signals are provided between different pairs of terminals and the output is measured as the resistance between yet another pair of terminals. Logic functionality is achieved through relationships between the applied input signals and the measured output resistance where the relationship is governed by the effect of the input signals on the structural state and the electrical resistance of the phase-change material. Logic values may be associated with the crystalline and amorphous states of the phase-change material or the measured resistance between a pair of terminals. U.S. Pat. No. 7,186,998B2 discloses a method of operating a phase-change memory cell, thereby to achieve a given logic functionality. The disclosed phase-change memory cell has three terminals, whereby the respective input signals applied across two different pairs of terminals may be used to create crystalline or amorphous states in the phase-change material, having corresponding resistances that are discernible from each other and that may be used to represent requisite inputs of a given logic function. An output resistance measured between a third pair of terminals corresponds to the output of the logic function.

US2011/0096594A1 discloses techniques for reading phase change memory that mitigate resistance drift. One contemplated method includes applying a plurality of electrical input signals to the memory cell. The method includes measuring a plurality of electrical output signals from the memory cell resulting from the plurality of electrical input signals. The method includes calculating an invariant component of the plurality of electrical output signals dependent on the configuration of amorphous material in the memory cell. The method also includes determining a memory state of the memory cell based on the invariant component. In one embodiment of the invention disclosed in that document, the method further includes mapping the plurality of electrical output signals to a measurements region of a plurality of measurements regions. The measurements regions correspond to memory states of the memory cell.

SUMMARY

In one embodiment, a semiconductor stack for performing at least a logic operation includes adjacent layers arranged in a stacked configuration with each layer comprising at least a phase-change memory cell in which a phase-change material is provided between a heater electrical terminal and at least two further heater electrical terminals, the phase-change material between the heater electrical terminal and each of the two further heater electrical terminals being operable in one of at least two reversibly transformable phases, an amorphous phase and a crystalline phase; wherein the semiconductor stack, when in use, is configurable to store information by way of an electrical resistance of the phase of the phase-change material between each heater electrical terminal and each of the two further heater electrical terminals in each layer, and the logic operation is performed on the basis of the information stored in the adjacent layers.

In another embodiment, a method is disclosed for performing a logic operation with a semiconductor stack comprising adjacent layers arranged in a stacked configuration with each layer comprising at least a phase-change memory cell in which a phase-change material is provided between a heater electrical terminal and at least two further heater electrical terminals, the phase-change material between the heater electrical terminal and each of the two further heater electrical terminals being operable in one of at least two reversibly transformable phases, an amorphous phase and a crystalline phase. The method includes storing information by way of an electrical resistance of the phase of the phase-change material between each heater electrical terminal and each of the two further heater electrical terminals in each layer, and performing the logic operation on the basis of the information stored in the adjacent layers.

BRIEF DESCRIPTION OF THE DRAWINGS

Reference will now be made, by way of example, to the accompanying drawings, in which.

DETAILED DESCRIPTION

Figure 1:
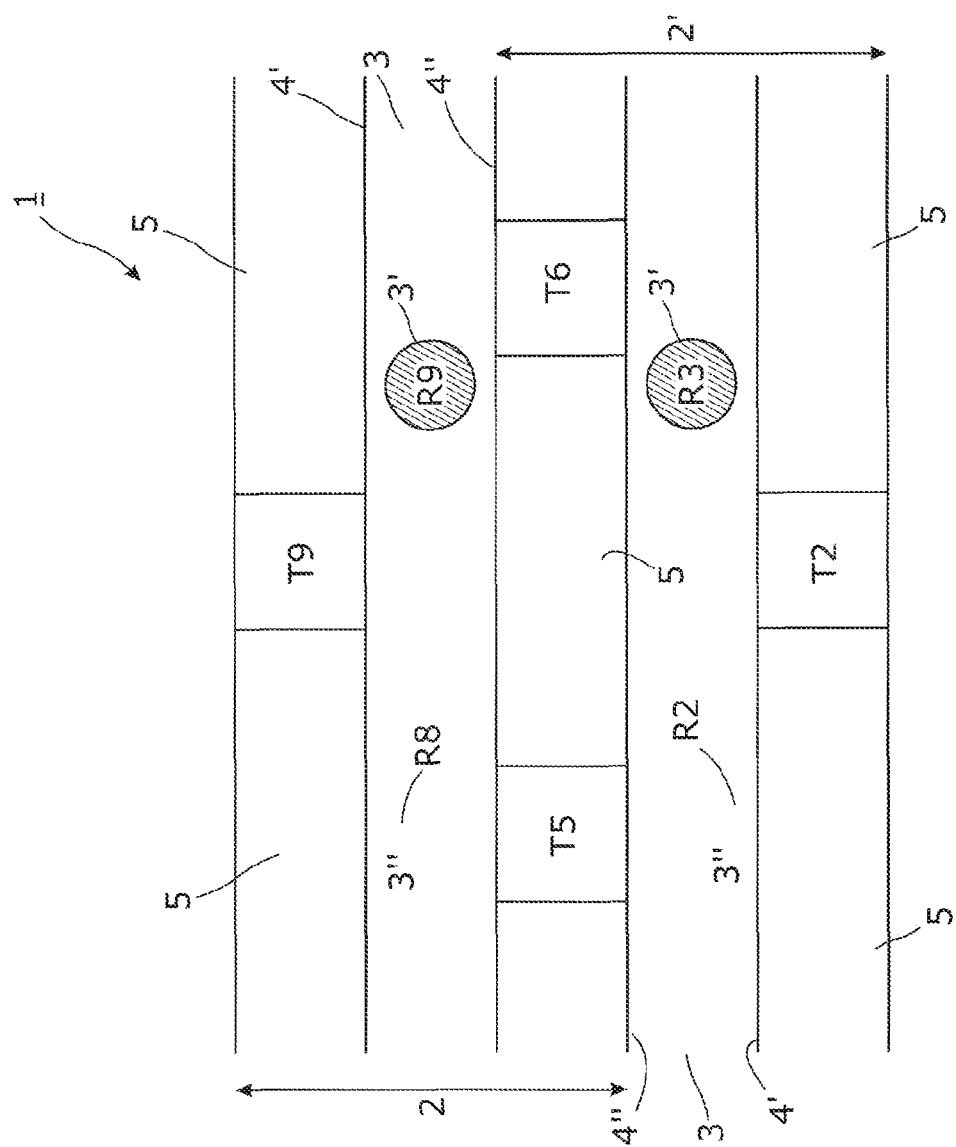
FIG. 1 is a cross-sectional view of a semiconductor stack according to an embodiment of the present invention.

According to an embodiment of a first aspect of the present invention, there is provided a semiconductor stack for performing at least a logic operation comprising: adjacent layers arranged in a stacked configuration with each layer comprising at least a phase-change memory cell in which a phase-change material is provided between a heater electrical terminal and at least two further heater electrical terminals, the phase-change material between the heater electrical terminal and each of the two further heater electrical terminals being operable in one of at least two reversibly transformable phases, an amorphous phase and a crystalline phase, wherein the semiconductor stack, when in use, is configurable to store information by way of an electrical resistance of the phase of the phase-change material between each heater electrical terminal and each of the two further heater electrical terminals in each layer, and the logic operation is performed on the basis of the information stored in the adjacent layers. Some advantages that may be associated with embodiments of the present invention compared to previously-proposed devices and/or techniques in which transistors are used include: an alternative to performing logic operations with transistors is provided; improved performance and/or efficiency since connections between the adjacent layers, the phase-change memory cells thereof and/or the electrical terminals associated with the phase-change memory cells may be facilitated without wire-connections, and relative ease of implementation and fabrication compared to previously-proposed devices and/or techniques in which an electrical circuit in which multiple transistors are wire-connected to each other is used to perform a given logic operation. Also, since the adjacent layers are provided in a stacked configuration, this may extend the advantage of an increased device density in a scenario where an embodiment of the present invention is integrated into/used in conjunction with a device/electrical circuit for performing logic operations. To be considered in respect of an embodiment of the present invention is that information corresponding to a given logic input is stored by way of an electrical resistance associated with one of the amorphous phase and the crystalline phase of the phase-change material provided between each heater electrical terminal and each of the two further heater electrical terminals in each layer. Because the amorphous and crystalline phases of the phase-change material are non-volatile, a separate step for loading logic inputs on which a logic operation is to be performed and/or storage space/memory for the logic inputs and/or logic output in respect of a given aspect of the logic operation that is performed may not be provided in an embodiment of the present invention.

The logic operation that is performed corresponds to a read operation in which the information stored in the adjacent layers between a set of read terminals is read. This feature may provide the advantage of ease of performing a logic operation as compared to previously-proposed devices and/or techniques because a logic operation is performed directly via a read operation conducted between a set of read terminals that are constituent in an embodiment of the present invention.

Logic inputs 1 and 0 are represented by the electrical resistances of the amorphous phase and the crystalline phase respectively of the phase-change material provided between the heater electrical terminal and each of the two further heater electrical terminals in the phase-change memory cell of each of the adjacent layers. This feature may extend the advantage of improved performance to an embodiment of the present invention since the logic inputs 1 and 0 may be effectively distinguished from each other on account of the electrical resistances of the amorphous phase and the crystalline phase of the phase-change material typically differing from each other by a few orders of magnitude. For the present implementation of an embodiment of the present invention, the logic operation that is performed preferably comprises a given logic OR operation, which corresponds to an aspect of the read operation comprising reading the information stored in the adjacent layers in at least a path between the set of read terminals. Also in respect of the present implementation of an embodiment of the present invention, the logic operation that is performed desirably comprises a logic AND operation, each of the logic inputs of the logic AND operation being generated in another aspect of the read operation comprising reading the information stored in the adjacent layers in a given path between the set of read terminals.

A selected set of read terminals is used for the read operation. In an embodiment of the present invention, different logic operations may be performed depending on the selection made for the set of read terminals to be used for the read operation. This feature extends the advantage of increasing the density of electrical/logic circuits in which an embodiment of the present invention may be integrated as compared to previously-proposed devices and/or techniques, particularly using transistors, where a single logic operation may typically be performed by a dedicated electrical circuit comprising multiple, interconnected transistors, so to perform the logic operations that may be possible with an embodiment of the present invention by choosing different sets of read terminals, multiples of such dedicated electrical circuits may be needed.

In an embodiment of the present invention, the logic operation that is performed occurs simultaneously with a write operation that is conducted in respect of write terminals that are provided in a write path of the adjacent layers, a given format of the information that is stored in at least a storage path in respect of the adjacent layers being modified according to the logic operation. This feature is associated with a write operation performed in an embodiment of the present invention; it provides an alternative way in which a logic operation may be performed in respect of the adjacent layers in an embodiment of the present invention. It may extend the advantages of versatility and efficiency to an embodiment of the present invention since a given format of information stored in the adjacent layers may be changed by the logic operation occurring simultaneously with the write-operation; such a change in information is facilitated without a two-step approach in which: a logic operation is performed in order to locate where the information is to be changed in the adjacent layers and, accordingly, performing a write operation to facilitate a desired change in the information stored at the location. In respect of the presently-described embodiment of the present invention, preferably, at least a write terminal is configurable to be supplied with a crystallizing voltage pulse relative to another write terminal. In this regard, the write terminals may be the heater electrical terminals and the further electrical terminals spanning the adjacent layers or constituent to one of the adjacent layers. By configuring at least one of the write terminals to be supplied with a crystallizing pulse relative to another write terminal, a logic operation is simultaneously performed where, for a given format of information stored in at least a storage path in respect of the adjacent layers, the phase of the phase-change material provided between at least one of the heater electrical terminals and a further heater electrical terminal of the phase-change memory cell in one of the adjacent layers may be changed from the amorphous phase to the crystalline phase. This feature may extend the advantage of ease with which a change in the information stored in an embodiment of the present invention is facilitated. Also, in the presently-described embodiment, information is desirably stored as, and in the location where it is, modified by the logic operation that is performed. The logic operation that is performed simultaneously with the write operation changes/modifies the information stored in the adjacent layers, for a given format being used for information storage in an embodiment of the present invention. The modified information corresponds to the logic output of the logic operation that is performed and it is stored in the location where the modification of information has been effectuated by the logic operation. By way of this feature, additional resources need not be provided in the way of space/memory for storing the logic output of the logic operation that is performed. Furthermore, an embodiment of the present invention combines logic and memory functionalities.

The two further heater electrical terminals are provided in common to the respective phase-change memory cells of the adjacent layers. This feature may extend the advantages of ease of fabrication and/or implementation including space economy since separate fabrication steps/structures/features need not be introduced to provide each phase-change memory cell in an embodiment of the present invention with its own pair of the two further heater electrical terminals.

For logic operation reconfiguration, the information stored between at least a heater electrical terminal and one of the two further heater electrical terminals in the phase-change memory cell in one of the adjacent layers is changed. The logic operations that are performed depend on how information is stored in the adjacent layers in an embodiment of the present invention and so are different for different formats being used for such information storage. By changing the information stored in at least one of the adjacent layers, for example, the heater electrical and one of the two further heater electrical terminals thereof, a different format of information storage in the adjacent layers is facilitated. Thus, the logic operations that may be performed in respect of an embodiment of the present invention are reconfigurable. This feature extends the advantages of ease of performance of different logic operations and increased versatility to an embodiment of the present invention.

According to a further embodiment of the present invention, there is provided an array comprising multiple semiconductor stacks, each semiconductor stack being according to embodiments of the first aspect of the present invention, the multiple semiconductor stacks being provided in electrical contact with and stacked relative to each other. Some advantages that may be associated with such an embodiment of the present invention include: each semiconductor stack may be applied for storing different information; each of the semiconductor stacks may be configured to perform different logic operations from each other on the basis of the information stored in each stack and the set of read terminals that are selected to perform the read operation in that stack, and a timing feature may be introduced in that each stack performs its designated logic operation at a given time relative to when the other stacks in the array perform their allocated logic operations. Due to the stacking arrangement of the multiple semiconductor stacks, increased device density and ease of incorporation into/integration with other devices and/or techniques may be facilitated.

The multiple semiconductor stacks are provided as stacked on each other, adjacent to each other or a combination thereof. Preferably, the multiple semiconductor stacks are three-dimensionally stacked relative to each other. These features may facilitate incorporation/integration of an embodiment of the present invention into devices/electrical circuits in a desired manner with regard to device density and space issues.

According to an embodiment of a method aspect of the present invention, there is provided a method of performing a logic operation with a semiconductor stack comprising adjacent layers arranged in a stacked configuration with each layer comprising at least a phase-change memory cell in which a phase-change material is provided between a heater electrical terminal and at least two further heater electrical terminals, the phase-change material between the heater electrical terminal and each of the two further heater electrical terminals being operable in one of at least two reversibly transformable phases, an amorphous phase and a crystalline phase, the method comprising the steps of: storing information by way of an electrical resistance of the phase of the phase-change material between each heater electrical terminal and each of the two further heater electrical terminals in each layer, and performing the logic operation on the basis of the information stored in the adjacent layers.

A corresponding use aspect is also provided and so, according to an embodiment of a use aspect of the present invention, there is provided a use of a semiconductor stack for performing at least a logic operation, the semiconductor stack comprising: adjacent layers arranged in a stacked configuration with each layer comprising at least a phase-change memory cell in which a phase-change material is provided between a heater electrical terminal and at least two further heater electrical terminals, the phase-change material between the heater electrical terminal and each of the two further heater electrical terminals being operable in one of at least two reversibly transformable phases, an amorphous phase and a crystalline phase, wherein the semiconductor stack, when in use, is configurable to store information by way of an electrical resistance of the phase of the phase-change material between each heater electrical terminal and each of the two further heater electrical terminals in each layer, and the logic operation is performed on the basis of the information stored in the adjacent layers.

Features of one aspect may be applied to any other aspect and vice versa. Any disclosed embodiment may be combined with one or several of the other embodiments shown and/or described. This is also possible for one or more features of the embodiments.

Within the description, the same reference numerals or signs have been used to denote the same parts or the like.

As shown in FIG. 1, in an embodiment of the present invention, there is provided a semiconductor stack 1 for performing at least a logic operation. The semiconductor stack 1 comprises adjacent layers 2, 2' arranged in a stacked configuration, with each layer 2, 2' comprising at least a phase-change memory cell. For each of the phase-change memory cells in the adjacent layers 2, 2', a phase-change material 3 is provided between a heater electrical terminal T2, T9 and at least two further heater electrical terminals T5, T6. The phase-change material 3 as hereinbefore mentioned is operable in one of at least two reversibly transformable phases, an amorphous phase 3' and a crystalline phase 3". In the amorphous phase 3', the phase-change material 3 has a discernibly higher electrical resistance compared to the crystalline phase 3" thereof, there being, typically, a two to three orders, and up to five orders of magnitude contrast in the electrical resistance between the respective phases. For the phase-change material 3, a suitably chosen germanium antimony tellurium alloy may be used, for example.

For the respective phase-change memory cells of the adjacent layers 2, 2', the heater electrical terminal T2, T9 is provided on a first surface 4' of the phase-change material 3 and the two further heater electrical terminals T5, T6 are provided on a second surface 4" arranged opposite to the first surface 4' of the phase-change material 3. The two further heater electrical terminals T5, T6 are provided in common to/shared by the respective phase-change memory cells of the adjacent layers 2, 2'.

The heater electrical terminals T2, T9 are provided in electrical communication with each of the two further heater electrical terminals T5, T6. The heater electrical terminals T9, T2 and the further heater electrical terminals T5, T6 may comprise titanium nitride or tungsten, for example, and they may be electrically isolated from each other by way of an insulator 5 that is chosen to comprise a material preferably having both electrical isolation and thermal insulation properties such as, for example, silicon nitride or silicon oxide.

When in use, an embodiment of the present invention is configurable to store information by way of an electrical resistance R2, R8, R3, R9 of the phase 3", 3' of the phase-change material 3 between each heater electrical terminal T2, T9 and each of the two further heater electrical terminals T5, T6 in each of the adjacent layers 2, 2'. A desired phase 3", 3' of the phase-change material 3 between any of the heater electrical terminals T2, T9 and any one of the further heater electrical terminals T5, T6 may be facilitated by applying a given phase-altering signal, such as, for example, a voltage pulse between the aforementioned electrical terminals. The logic operation that is performed is done on the basis of the information R2, R8, R3, R9 stored as hereinbefore described in the adjacent layers 2, 2'.

In a first variation of an embodiment of the present invention, the logic operation that is performed corresponds to a read operation in which the information R2, R8, R3, R9 stored in the adjacent layers 2, 2' between a set of read terminals T2-T9; T5-T6 is read. The information that is stored in the adjacent layers 2, 2', is used to represent the logic inputs in respect of the logic operation that is performed via the read operation. Thus, logic inputs 1 and 0 may be represented by the electrical resistances R2, R8, R3, R9 of the amorphous phase 3' and the crystalline phase 3" respectively of the phase-change material 3 provided between the heater electrical terminal T2, T9 and each of the two further heater electrical terminals T5, T6 in the phase-change memory cell of each of the adjacent layers 2, 2'.

The set of read terminals T2-T9; T5-T6 may comprise a pair of electrical terminals in the semiconductor stack 1, a combination of which is chosen to be different from any combination of the electrical terminals T2-T5, T5-T9, T2-T6, T6-T9 between which information R2, R8, R3, R9 is stored in the respective phase-change memory cells of the adjacent layers 2, 2'. The read operation and the corresponding logic operation that is performed depends on a selection made of the read terminals T2-T9; T5-T6. In this regard, a read signal may be propagated so as to simultaneously access any path T2-T5-T9, T2-T6-T9; T5-T9-T6, T5-T2-T6 between the selected set of read terminals T2-T9; T5-T6. Each such path T2-T5-T9, T2-T6-T9; T5-T9-T6, T5-T2-T6 comprises a route between the set of read terminals T2-T9; T5-T6 in which information R2, R8, R3, R9 is stored in the adjacent layers 2, 2'. The electrical resistances R2, R8, R3, R9 in a path T2-T5-T9, T2-T6-T9; T5-T9-T6, T5-T2-T6 between the set of read terminals T2-T9; T5-T6 are connected in series with each other. In respect of multiple paths between the set of read terminals T2-T9; T5-T6, the electrical resistances R2, R8; R8, R9 in one of the multiple paths T2-T5-T9, T5-T9-T6 is connected in parallel with the electrical resistances R3, R9; R2, R3 in another of the multiple paths T2-T6-T9, T5-T2-T6 between the selected set of the read terminals T2-T9; T5-T6.

In the first variation of an embodiment of the present invention as above-described, the logic operation may comprise a given logic OR operation, which corresponds to an aspect of the read operation in which the information stored in the adjacent layers 2, 2' in at least a path T2-T5-T9, T2-T6-T9; T5-T9-T6, T5-T2-T6 between the set of read terminals T2-T9; T5-T6 is read. Furthermore, and in respect of another aspect of the read operation, the logic operation that is performed may comprise a logic AND operation, each of the logic inputs thereof being generated by reading the information stored in the adjacent layers 2, 2' in a given path between T2-T5-T9, T2-T6-T9; T5-T9-T6, T5-T2-T6 the set of read terminals T2-T9; T5-T6.

To gain an understanding of the first variation of an embodiment of the present invention and with reference being made to FIG. 1, logic inputs 1 and 0 are represented by the electrical resistances of the amorphous phase R3, R9, 3' and the crystalline phase R2, R8, 3" by way of which information is stored in the adjacent layers 2, 2'. A given logic OR operation is performed on the logic inputs 1, 0 corresponding to the series-connected electrical resistances in a path between the set of read terminals in which information is stored between the adjacent layers 2, 2'. The logic AND operation is performed for the electrical resistances in a path between the set of read terminals being connected in parallel with the electrical resistances in another path between the set of read terminals, each of the logic inputs for the logic AND operation being generated in a respective logic OR operation conducted for each of the paths between the set of read terminals as hereinabove described. So, with reference to FIG. 1, a read operation between the set of read terminals T2 and T9 corresponds to the logic operation: (R2 OR R8) AND (R3 OR R9), which yields a logic output 0, and a read operation between the set of read terminals T5 and T6 corresponds to the logic operation: (R2 OR R3) AND (R8 OR R9), which yields a logic output 1. Thus, different logic operations may be performed using different sets of read terminals for the same information being stored between the adjacent layers 2, 2'.

In a second variation of an embodiment of the present invention, a write operation is conducted with write terminals T5-T9 that are provided in a write path T2-T5-T9 of the adjacent layers 2, 2'. Simultaneously with the write operation, a logic operation is performed according to which the information stored in a given format in a given storage path T2-T6-T9 in the adjacent layers 2, 2' is modified. As explained generally hereinabove with reference to FIG. 1, information can be stored in the given storage path T2-T6-T9 with the electrical resistances R3, R9, which may be associated with the amorphous 3' and crystalline 3" phases of the phase change material 3 provided between the respective combination of heater-electrical terminals T2, T9 and further heater electrical terminal T6 in the given storage path T2-T6-T9. In the present example, logic values 1, 0 are respectively used for representing the amorphous phase 3' and the crystalline phase 3". The information R3, R9 stored in the given storage path T2-T6-T9 may comprise the logic inputs 1, 0 of a logic AND operation that is performed simultaneously with the write operation. In the write operation, a crystallizing voltage pulse V1 may be applied to the write terminals T2, T5 with respect to another write terminal T9 in the write path T2-T5-T9 whilst terminal T6 in the given storage path T2-T6-T9 is left floating. The logic AND operation that is simultaneously performed with the write operation causes information R3, R9 stored in the given storage path T2-T6-T9 to be modified. The modified information comprises the logic output 1, 0 of the logic AND operation; it is stored in the location in the given storage path T2-T6-T9 where the modification of the information has occurred due to the logic AND operation.

For the crystallizing voltage pulse V1 being applied as mentioned hereinabove in the write operation, and for the information stored in the given storage path T2-T6-T9 by respective electrical resistances R3, R9 representing logic input combinations 1, 1 or 0, 0, no modification of the information stored in the given storage path T2-T6-T9 will occur as a consequence of the logic AND operation that is performed simultaneously with the write operation. In contrast, only where the respective electrical resistances R3, R9 represent the logic input combination 0, 1, or 1, 0, performing the write operation as above-described causes a modification of that electrical resistance R3, R9 in the given storage path that corresponds to the amorphous phase 3', logic value 1, being changed to the crystalline phase 3", logic value 0. The modified information R3, R9, 3" corresponds to the logic output 0 of the logic AND operation in the present case. The modified information is stored back in the location where the modification of information has been effectuated by the logic AND operation, that is, by way of modified electrical resistance R3, R9 between the respective combination of heater electrical terminal T2, T9 and the further heater electrical terminal T6 in the storage path T2-T6-T9 spanning adjacent layers 2, 2'.

The second variation of an embodiment of the present invention is, of course, not limited to the above-given example and, in fact, modification of the information stored in any desired storage path in one or both of the adjacent layers 2, 2' by performing a write operation in respect of a suitably chosen write path/write terminals is also encompassed within the scope of the present invention.

Figure 2:
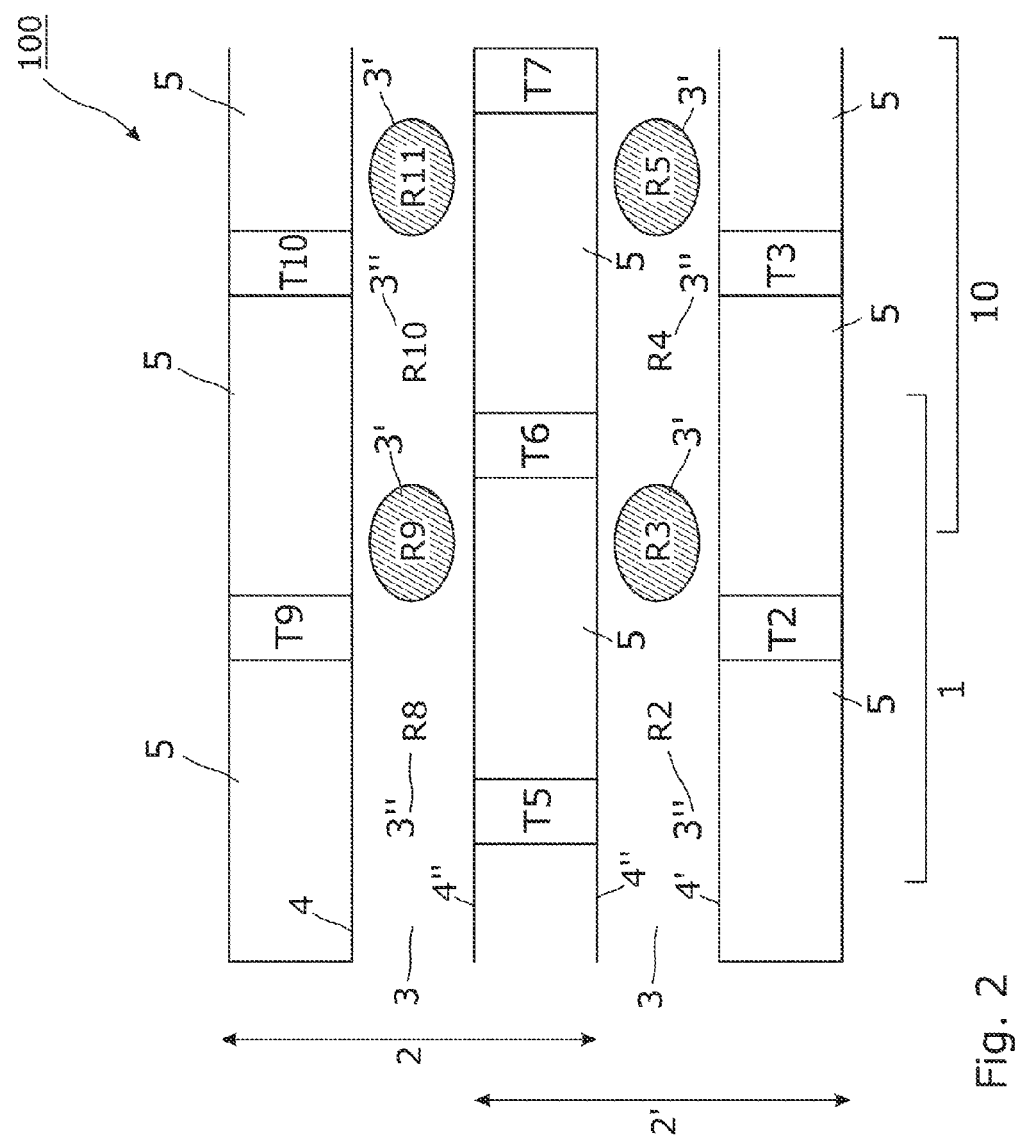
FIG. 2 is a cross-sectional view of a semiconductor stack according to another embodiment of the present invention.

According to another embodiment of the present invention as shown in FIG. 2, there is provided an array 100 comprising multiple semiconductor stacks 1, 10 provided in electrical contact with and stacked relative to each other. Each of the semiconductor stacks 1, 10 in the array 100 has features and advantages corresponding to an embodiment of the present invention as described with reference to FIG. 1. So, semiconductor stack 10 comprises adjacent layers 2, 2', with each layer 2, 2' comprising a phase-change memory cell. Each phase-change memory cell comprises a phase-change material 3 provided between a heater electrical terminal T10, T3 and two further heater electrical terminals T6, T7, the heater electrical terminals T10, T3 being provided in electrical communication with each of the two further heater electrical terminals T6, T7. As can be seen from the example of FIG. 2, the information stored by way of the electrical resistances R4, R10 corresponds to a logic input 0 and the electrical resistances R5 and R11 corresponds to a logic input 1.

In the example shown in FIG. 2, each of the semiconductor stacks 1, 10, are provided adjacent to each other; they have in common between them the further heater electrical terminal T6. Although not shown, in a variation of an embodiment of the present invention, the multiple semiconductor stacks 1, 10 may be provided stacked on top of each other. By way of example, and with reference being made to the structural features of the semiconductor stacks 1, 10 as shown in FIG. 2, for semiconductor stack 10 being provided on semiconductor stack 1, they would share between them a heater electrical terminal, which in the present example may be heater electrical terminal T9 of semiconductor stack 1 or T3 of semiconductor stack 10. In a further variation of an embodiment of the present invention, the above-described stacking arrangements may be combined to obtain a two-dimensionally stacked array 100 comprising at least a semiconductor stack 1 with respective semiconductor stacks 10 provided on top of and adjacent to it. In this regard, and by way of example, at least two structural features, namely, one of the heater electrical terminals T9, T3 and one of the two further heater electrical terminals T6 are shared between the stacks 1, 10 in this arrangement. In a yet further variation of an embodiment of the present invention, the multiple semiconductor stacks 1, 10 may be stacked three-dimensionally relative to each other.

In an embodiment of the present invention, the logic operations that are performed depend on the information R2, R8, R3, R9 stored in the adjacent layers 2, 2'. To facilitate logic operation reconfiguration, the information stored between at least a heater electrical terminal T2, T9 and one of the two further heater electrical terminals T5, T6 in the phase-change memory cell in one of the adjacent layers 2, 2' is changed.

An embodiment of the present invention is not limited to the read operation being started from a given read terminal. Also encompassed within the scope of the present invention is when a logic input 1 is represented by the electrical resistance of the crystalline phase of the phase-change material between a given set of write terminals and when a logic input 0 is represented by the electrical resistance of the amorphous phase of the phase-change material between a given set of write terminals.

The present invention has been described purely by way of example and modifications of detail may be made within the scope of the invention.

Each feature disclosed in the description, and where appropriate, the claims and the drawings, may be provided independently or in any appropriate combination.

The invention claimed is:

1. A method of performing a logic operation with a semiconductor stack comprising adjacent layers arranged in a stacked configuration with each layer comprising at least a phase-change memory cell in which a phase-change material is provided between a heater electrical terminal and at least two further heater electrical terminals, the phase-change material between the heater electrical terminal and each of the two further heater electrical terminals being operable in one of at least two reversibly transformable phases, an amorphous phase and a crystalline phase, the method comprising:
   storing information by way of an electrical resistance of the phase of the phase-change material between each heater electrical terminal and each of the two further heater electrical terminals in each layer, and performing the logic operation on the basis of the information stored in the adjacent layers.

2. The method of claim 1, wherein the logic operation that is performed corresponds to a read operation in which the information stored in the adjacent layers between a set of read terminals is read.

3. The method of claim 2, wherein logic inputs 1 and 0 are represented by the electrical resistances of the amorphous phase and the crystalline phase respectively of the phase-change material provided between the heater electrical terminal and each of the two further heater electrical terminals in the phase-change memory cell of each of the adjacent layers.

4. The method of claim 2, wherein the logic operation comprises a given logic OR operation, which corresponds to an aspect of the read operation comprising reading the information stored in the adjacent layers in at least a path between the set of read terminals.

5. The method of claim 2, wherein the logic operation that is performed comprises a logic AND operation, each of the logic inputs of the logic AND operation being generated in another aspect of the read operation comprising reading the information stored in the adjacent layers in a given path between the set of read terminals.

6. The method of claim 2, wherein a selected set of read terminals is used for the read operation.

* * * * *